United States Patent [19]

Polley et al.

[11] Patent Number: 4,614,383

[45] Date of Patent: Sep. 30, 1986

[54] CABLE CARRIER/RETRACTOR

[75] Inventors: Bradford L. Polley; Gary P. Priester, both of San Diego, Calif.

[73] Assignee: General Dynamics, Electronics Division, San Diego, Calif.

[21] Appl. No.: 687,957

[22] Filed: Dec. 31, 1984

[51] Int. Cl.⁴ ............ A47B 81/00; H01B 7/06; H05K 7/16
[52] U.S. Cl. .................... 312/273; 174/69; 174/DIG. 9; 361/391
[58] Field of Search ............ 312/270, 271, 272, 272.5, 312/273, 274, 320; 174/69, DIG. 9; 361/390, 391

[56] References Cited

U.S. PATENT DOCUMENTS

| | | | |
|---|---|---|---|
| 2,865,979 | 12/1958 | Klassen | 174/69 |
| 3,020,511 | 2/1962 | Raver | 361/391 |
| 3,120,411 | 2/1964 | Strumpell | 174/69 |
| 3,138,655 | 6/1964 | Navarro et al. | 174/69 |
| 3,219,750 | 11/1965 | Davies | 174/DIG. 9 |
| 3,257,156 | 6/1966 | Sisk et al. | 174/69 |
| 3,295,905 | 1/1967 | Sisk et al. | 174/69 |
| 3,335,326 | 8/1967 | Bonin et al. | 174/69 |
| 3,433,889 | 3/1969 | De Vriers | 312/273 |
| 3,448,346 | 6/1969 | Webb | 174/69 |
| 3,676,572 | 7/1972 | Davies | 174/69 |
| 3,710,199 | 1/1973 | Cignoni, Jr. | 174/DIG. 9 |

OTHER PUBLICATIONS

Hillary et al., IBM Technical Disclosure Bulletin, pp. 2030 and 2031, vol. 21, No. 5, Oct. 1978.

Primary Examiner—William E. Lyddane
Assistant Examiner—Gerald A. Anderson
Attorney, Agent, or Firm—Brown, Martin & Haller

[57] ABSTRACT

A cable carrier/retractor for supporting, protecting and guiding a cable to an equipment drawer in a cabinet including a framework while at the same time allowing for addition or removal of cables without any disassembly of the mechanism. The carrier supports a cable from an entry position adjacent to the framework of the drawer to an exit position adjacent to the back panel of the drawer. The carrier generally comprises a first having an entry end for supporting a cable from the entry position to an intermediate position, and a second channel for supporting the cable from an intermediate position to the exit position, a hinged mount connecting the first channel to the frame, and an intermediate hinge for connecting the channels. In a preferred embodiment, a retaining hinge connected to a drawer-mounted slide member or the drawer back panel holds the exit end of the second channel in a position adjacent to the back panel. The channels are vertically offset relative to one another on the intermediate hinge such that the channels may attain in a fully retractable position a substantially top-to-bottom relationship in a plane perpendicular to the direction of drawer travel. The intermediate hinge is under center whereby a rearward force on the exit end decreases the angle between the channels moving them to the retracted position.

2 Claims, 5 Drawing Figures

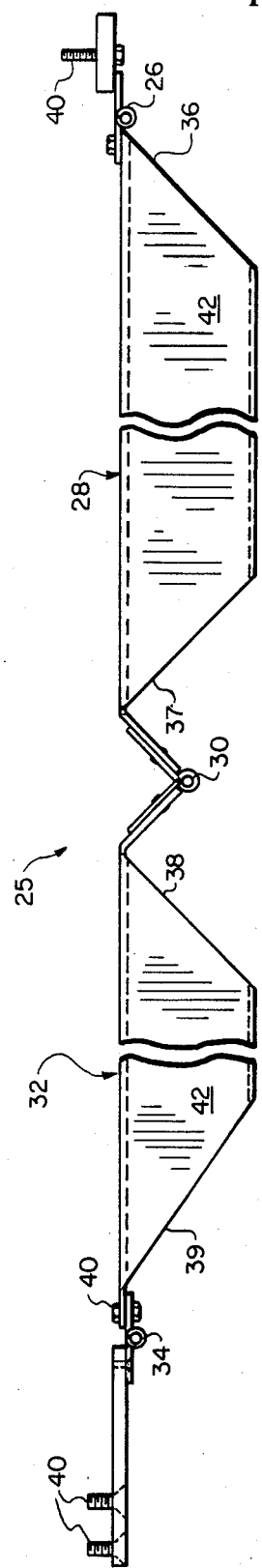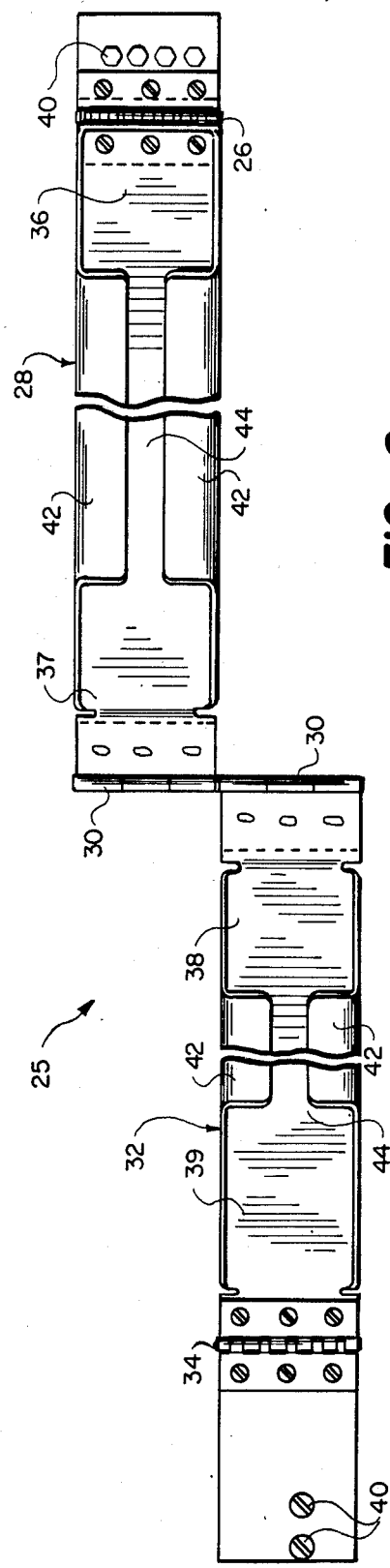

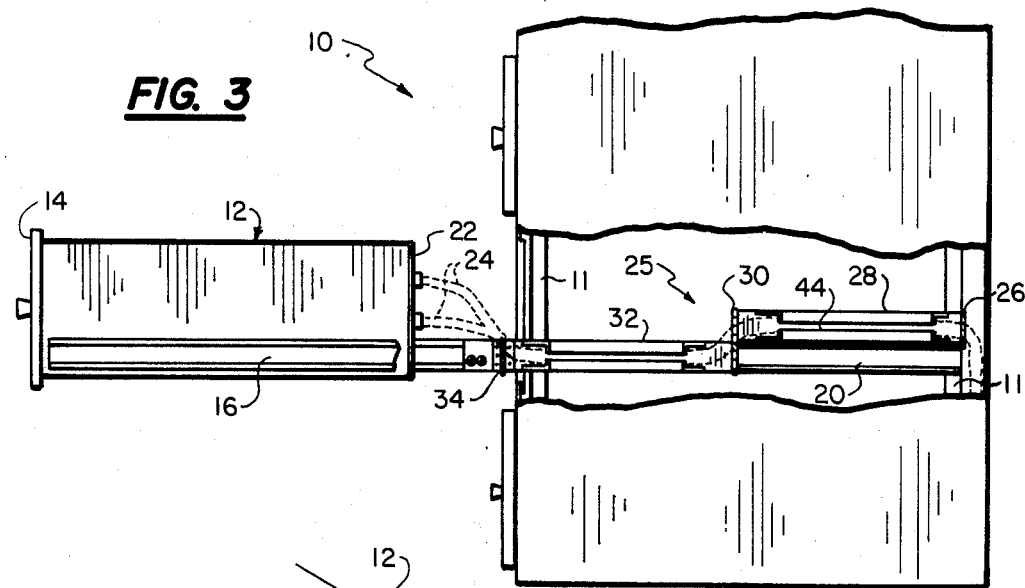
FIG. 3
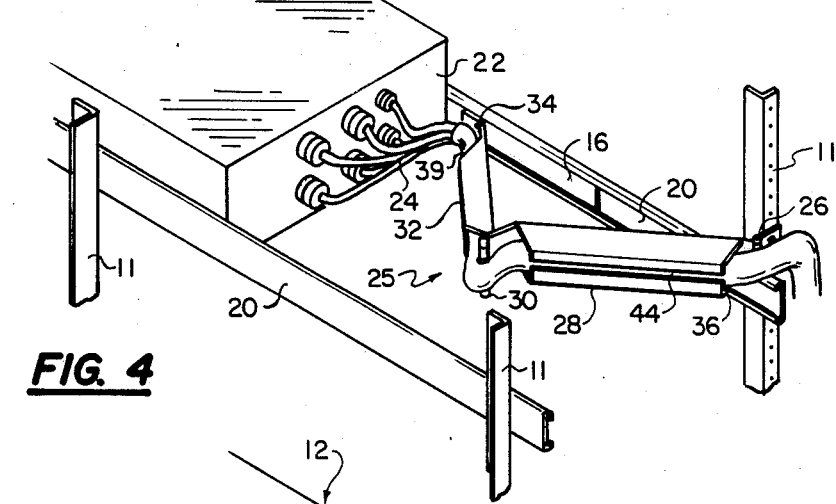
FIG. 4
FIG. 5

CABLE CARRIER/RETRACTOR

FIELD OF THE INVENTION

This invention relates in general to a cable carrier/retractor and more particularly to a mechanism that will hold, support and protect cables at the rear of drawers of electronic equipment cabinets in a manner to permit the drawers to be pulled out easily without disconnecting cables attached thereto, while at the same time allowing for addition or removal of cables without disassembly of the mechanism.

BACKGROUND OF THE INVENTION

Electronic components are often permanently mounted and operated within sliding drawers or racks of cabinet assemblies. Electrical conductors extend from some point on the drawers to a junction on the cabinet structure and the drawers are regularly pulled out for inspection, operation and maintenance of the electronic equipment contained therein. The cables to each drawer must be long enough to permit the drawer to be opened a sufficient amount for manually connecting or disconnecting the connector plug and for repair, test, modification or other purpose. This necessary length of the cable results in a surplus length of cable when the drawer is fully closed. It is necessary to hold, support and protect cables during drawer insertion to allow free movement of the drawer, to prevent damage to the cable, and to prevent the cable from interfering with electronic components and adjacent drawers.

Conventional cable carrier/retractor mechanisms typically require the cable to be fastened to the carrier along its length by a plurality of mechanical retaining devices, such as cable ties. To add or remove a cable it is necessary to remove or disassemble the fasteners.

Other previous means of cable carrying/retraction accordion out from the rear of the cabinet and therefore occupy excessive space and do not allow optimum insertion depth of the drawer.

Therefore it is desirable to have a cable carrier/retractor that will hold, support, and protect cables while at the same time allowed for addition and removal of cables without disassembly of any of the mechanism.

It is further desirable that such mechanism retract to the rear of the cabinet to allow for the greatest insertion depth of an equipment drawer.

SUMMARY OF THE INVENTION

This invention is a cable carrier/retractor for holding, supporting and protecting cables while allowing for the easy addition and removal of cables without disassembly of any of the mechanism. The carrier is intended for use in a cabinet including a framework having an equipment drawer therein and a cable extending from the rear of the drawer to the rear of the framework. The carrier supports the cable between an entry position adjacent to the framework to the rear of the drawer to an exit position adjacent to the rear of the drawer. The carrier generally comprises a mounting hinge fastened to the rear framework, a first channel connected to the mounting hinge for supporting the cable from the entry position to an intermediate position, a second channel having an exit end for supporting the cable from the intermediate position to the exit position, and an intermediate hinge for hinged connection of the channels at the intermediate position.

According to the invention, the channels are comprised of walls defining a continuous slit along a length of the channel for insertion and removal of a cable. Once a cable is inserted through the slit, the cable is retained within the confines of the channel walls.

In the exemplary embodiment, a retaining hinge holds the exit end of the second channel at the exit position. The exit position adjacent to the rear of the drawer. The channels are vertically offset on the intermediate hinge so that they may swing to a substantially parallel, top-to-bottom relationship in a plane that is perpendicular to the direction of drawer travel. The intermediate hinge is off center (under center) so that rearward force on the exit end will decrease the angle between the channels thereby retracting the cable.

Other features and many attendant advantages of the invention will become apparent upon a reading of the following detailed description together with the drawings, in which like reference numerals refer to like parts throughout.

The drawings disclose by way of example, and not by way of limitation, the principals of the invention, and structural implementation of the inventive concepts.

BRIEF DESCRIPTION OF THE DRAWING

FIG. 1 is a top view of a preferred embodiment of the cable carrier/retractor of the present invention in a fully extended position.

FIG. 2 is a side view of the cable carrier/retractor of FIG. 1.

FIG. 3 is a side, partially cut away view of a typical cabinet and equipment drawer with the device of FIG. 1 in the fully extended position.

FIG. 4 is a perspective view of a preferred embodiment of the cable carrier/retractor in partially retracted position as viewed from the rear of the cabinet.

FIG. 5 is a perspective view of the carrier of FIG. 4 in the fully retracted position.

DETAILED DESCRIPTION OF THE INVENTION

With reference now to the drawings, there is shown a preferred embodiment of the cable carrier/retractor of the present invention. As illustrated in FIG. 3, a typical equipment cabinet, shown generally as 10 has a framework 11 and contains drawer 12 housing electronic or other equipment. Drawer 12 is inserted into the front of the cabinet and slid towards the rear of the cabinet usually to a position where the drawer front panel 14 is secure on the front of the cabinet. A handle or knob 16 is located on the front panel 14 for withdrawing the drawer from the cabinet.

FIG. 3 depicts a typical drawer mounting arrangement wherein sliding members 16, 18 and 20 having bearings or rollers allow the drawer to be easily inserted or retracted from the cabinet. Drawer-mounted slide member 16 is mounted on the side of the drawer 12. Frame slide member 20 is mounted between the front and rear frame members. Transition member 18 allows the drawer to be supported outside of the cabinet 10. Slide mounting of the drawer in this manner allows full access to the contents of the drawer and to the back panel 22 of the drawer while the drawer is fully supported outside of the cabinet. Electrical conductors or cables 24 carry power and other inputs or outputs. The cable carrier/retractor, shown generally as 26, supports and guides the cables 24 to the drawer 12 from the rear of the cabinet. Thus, with the drawer 12 in fully extended position as shown in FIG. 3, access is provided to the equipment therein, cables can be connected or disconnected, and the equipment can be checked and repaired without disconnecting the input and output cables from the back panel 22 if desired.

With reference now to FIGS. 1 and 2, there is shown in more detail a preferred embodiment of the cable carrier/retractor 25 of the present invention. The carrier's main elements are mounting hinge 26, first channel 28, intermediate hinge 30, second channel 32 and retaining hinge 34.

The first channel 28 has an entry end 36 and a second end 37. The second channel has a first end 38 and an exit end 39. The first end 38 is connected to the second end 37 of the first channel 28 by an intermediate hinge 30.

Mounting hinge 26 is fastened by any suitable fastening means, such as screws or bolts 40, to the first channel. The mounting hinge 26 supports the first channel 28 and allows it to swing in a horizontal plane. Intermediate hinge 30 connects the first and second channels 28, 32 between the second end 37 and the first end 38 and supports second channel 32.

As best seen in FIG. 2, the channels 28, 32 are vertically offfset relative to one another on the intermediate hinge 30. This allows the channels 28, 32 to be folded to a parallel, co-planar, top-to-bottom relationship in the fully retracted position. Retaining hinge 34 is fastened with any suitable fasteners, such as screws or bolts 40, to the exit end 39 of the second channel and to the drawer-mounted slide member 16 adjacent to the drawer back panel 22.

As seen in FIG. 1, the pivot point for intermediate hinge 30 is off center (under center) and therefore a rearward force on the exit end 39 such as by insertion of the drawer 12, will cause the carrier to fold and retract.

The first and second channels 28, 32 have walls 42 defining a space for supporting and retaining a cable place therein. As best seen in FIG. 2, an obstructed, continuous slit 44 through the wall 42 allows free rein of a cable in the carrier 25.

Turning again to FIG. 3, the carrier 25 is shown in fully extended position to install the preferred embodiment of the carrier 25, mounting hinge 26 is attached to rear frame 11 and retaining hinge 34 is attached to drawer-mounted slide member 16 to the rear of drawer back panel 22. Cables 24 extending to the drawer are routed through the back of the cabinet 10, laid through slit 34, and connected to the drawer 12, usually to mating connectors on the back panel 22.

With reference now to FIGS. 4 and 5, there is shown a perspective view of a preferred embodiment of the cable carrier/retractor of the present invention. In FIG. 4, the equipment drawer 12 is in an intermediate position, being part in and part out of a cabinet. Cabinet framework 11 supports drawer slide member 20 which in turn guides and supports drawer-mounted slide member 16 which is mounted upon and supports the equipment drawer 12. Cables 24 are shown routed through the carrier 25 from the rear of the cabinet into the entry end 36 and out exit end 39 to a point adjacent the rear panel 22. The cables 24 are supported by first channel 28 and second channel 32. Mounting hinge 26 connects the first channel 28 to the framework 11, supports the first channel 28 and allows it to move in a horizontal arc. Intermediate hinge 30 connects the first and second channel 28, 32 and supports the second channel 32.

Second channel 32 is mounted on intermediate hinge 30 with a vertical displacement relative to the first channel 28 such that it may rotate under first channel 28. Intermediate hinge 30 is disposed off center (under center) between mounting hinge 26 and retaining hinge 34. Therefore, rearward forces on the exit end 39 such as when the equipment drawer 12 is pushed into the cabinet, moves the channel 28, 32 to decrease the angle between them, thereby retracting the cable.

Retaining hinge 34 may be fastened to drawer-mounted slide member 16, the drawer back panel 22 or other suitable fixture that moves with the drawer 12. Alternately, in some applications, retaining hinge 34 is not necessary, and the cables 24 themselves will provide sufficient force at the exit end 39 to cause the carrier 25 to retract and extend.

FIG. 5 illustrates the carrier 25 in the fully retracted position when equipments drawer 12 is fully inserted. The channels 28, 32 may attain a substantially parallel, top-to-bottom relationship in a plane perpendicular to the direction of drawer travel. This configuration utilizes cabinet space most efficiently as the carrier is contained in a channel-width wide vertical plane.

From the foregoing description, it will be seen that the present invention provides an extremely efficient and reliable manner of supporting cables to a moveable equipment drawer while allowing for addition or removal of cables without a disassembly of the any of the mechanism.

Having described a preferred embodiment of the present invention, alteration and modification will likely occur to those skilled in the art. For example, the cable-laying slit may be located on top of the channels. Also, in a long, narrow cabinet, another pair of channels could be added to increase the extended lip of the carrier.

Therefore, it is intended to cover in the appended claims such as modifications and changes as come within the true spirit and scope of the invention.

What I claim is:

1. In a cabinet including a framework having a drawer therein, and a cable extending from said drawer to the rear of said framework, said cable being of a length substantially greater than the distance between the rear of said drawer and the rear of said framework, a device for supporting said cable in a substantially horizontal configuration from an entry position adjacent said framework to the rear of said drawer, to an exit position adjacent the rear of said drawer, said device comprising:

a mounting hinge for mounting on said frame to the rear of said drawer for connecting an entry end of a first channel to said frame;

a first channel for supporting said cable from said entry position adjacent said framework to the rear of said drawer to an intermediate position, said first channel comprising:
an entry end; and
a second end;

a connecting hinge connecting said second end of said first channel with a first end of a second channel;

a second channel for supporting said cable from said intermediate position to said exit position adjacent the rear of said drawer, said second channel comprising:
a first end; and
an exit end for positioning adjacent the rear of said drawer; and a retaining hinge connected to said drawer and to said exit end of said second channel for retaining said exit end adjacent the rear of said drawer; and wherein said first and second channels have a horizontal width and have walls defining a continuous orifice along a length of said channel for insertion and removal of said cable, said walls for supporting and retaining said cable within said channel; and wherein said connecting hinge is under center between said mounting hinge and said retaining hinge, said connecting hinge being located approximately mid-width of the channel, and wherein said channels are vertically offset relative to one another on said connecting hinge whereby, in a fully retracted position, said channels may attain a top-to-bottom relationship in a plane perpendicular to the direction of drawer travel, and, when said drawer is moved forward and said channels are in a fully extended position, said channels may attain a substantially linear relationship in a substantially horizontal plane.

2. The device of claim 1 wherein the width of said orifice is just sufficient for passage therethrough of said cable.

* * * * *